US010483990B2

(12) United States Patent
Xiu

(10) Patent No.: US 10,483,990 B2
(45) Date of Patent: Nov. 19, 2019

(54) FREQUENCY COMPENSATOR, ELECTRONIC DEVICE AND FREQUENCY COMPENSATION METHOD

(71) Applicant: BOE Technology Group Co., Ltd., Beijing (CN)

(72) Inventor: Liming Xiu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/952,531

(22) Filed: Apr. 13, 2018

(65) Prior Publication Data

US 2019/0052276 A1 Feb. 14, 2019

(30) Foreign Application Priority Data

Aug. 9, 2017 (CN) .......................... 2017 1 0675943

(51) Int. Cl.
*H03L 7/085* (2006.01)
*H03L 7/099* (2006.01)
*H03K 5/135* (2006.01)

(52) U.S. Cl.
CPC ............ *H03L 7/085* (2013.01); *H03K 5/135* (2013.01); *H03L 7/099* (2013.01); *H03L 7/0996* (2013.01)

(58) Field of Classification Search
CPC ....... H03L 7/085; H03L 7/099; H03L 7/0991; H03L 7/0992; H03L 7/0995
See application file for complete search history.

(56) References Cited

U.S. PATENT DOCUMENTS

| 6,429,693 | B1* | 8/2002 | Staszewski | ............. H03L 7/085 327/12 |
| 2014/0120855 | A1* | 5/2014 | Kuhn | ..................... H04B 17/21 455/226.1 |

* cited by examiner

Primary Examiner — Jung Kim
(74) Attorney, Agent, or Firm — Westman, Champlin & Koehler, P.A.

(57) ABSTRACT

A frequency compensator, an electronic device, and a frequency compensation method are disclosed. The frequency compensator includes a control circuit and a frequency compensation circuit. The control circuit is configured to generate a frequency control word according to an initial frequency and an target frequency. The frequency compensation circuit is configured to receive an input signal of an initial frequency, and to generate and output an output signal of a compensated frequency according to the frequency control word and the input signal of the initial frequency.

14 Claims, 6 Drawing Sheets

FREQUENCY COMPENSATOR, ELECTRONIC DEVICE AND FREQUENCY COMPENSATION METHOD

CROSS-REFERENCE TO RELATED APPLICATION(S)

This application claims priority to Chinese Patent Application No. 201710675943.8 entitled "FREQUENCY COMPENSATOR, ELECTRONIC DEVICE AND FREQUENCY COMPENSATION METHOD" and filed on Aug. 9, 2017, the disclosure of which is hereby incorporated by reference in its entirety.

TECHNICAL FIELD

Embodiments of the present disclosure relate to a frequency compensator, an electronic device, and a frequency compensation method.

BACKGROUND

A frequency source is a basic signal source of an electronic system, which mainly comprises a fixed point frequency source and a synthetic frequency source. A frequency source can be applied to electronic systems of military, metrology, industrial, consumer, communications networks, automotive, power grid, radar, communications, measurement and control, and navigation, and the like.

With the development of electronic technologies, the requirement of the electronic system for the stability of the frequency generated by the frequency source becomes higher and higher. The frequency stability of the frequency source will directly affect performance of the electronic system. For example, the Cellular Telephone System requires a microsecond-level precision to implement seamless handover synchronously. The Network Time Protocol (NTP) requires a millisecond-level time precision to achieve accurate time control at the application layer. Applications over Internet Protocol (IP), such as audio and video, require fixed frequencies providing good timing information. The frequency deviation for a typical frequency source, such as a crystal oscillator, is within a range of tens or even hundreds of ppm (parts per million). The frequency deviation of the frequency source may cause the performance of the electronic system to degrade.

SUMMARY

At least one embodiment of the present disclosure provides a frequency compensator comprising a control circuit and a frequency compensation circuit. The control circuit is configured to generate a frequency control word according to an initial frequency and a target frequency. The frequency compensation circuit is configured to receive an input signal of the initial frequency, and to generate and output an output signal of a compensated frequency according to the frequency control word and the input signal of the initial frequency.

For example, in a frequency compensator according to at least one embodiment of the present disclosure, the control circuit comprises: an input sub-circuit configured to obtain the initial frequency, the target frequency, and a frequency multiplication parameter; a calculation sub-circuit configured to generate the frequency control word according to the initial frequency, the target frequency and the frequency multiplication parameter; and an output sub-circuit configured to output the frequency control word to the frequency compensation circuit.

For example, in a frequency compensator according to at least one embodiment of the present disclosure, the frequency control word is:

$$F=(K \cdot N \cdot C \cdot f_c)/f_T,$$

wherein F represents the frequency control word, N represents the frequency multiplication parameter, $f_c$ represents the initial frequency, $f_T$ represents the target frequency, K represents a positive integer greater than 1, and C is a constant.

For example, in a frequency compensator according to at least one embodiment of the present disclosure, $C=1/K$, and the frequency control word is $F=(N \cdot f_c)/f_T$.

For example, in a frequency compensator according to at least one embodiment of the present disclosure, the frequency compensation circuit comprises: a reference time unit generation sub-circuit configured to receive an input signal of the initial frequency, and to generate and output a reference time unit according to the initial frequency; a frequency adjustment sub-circuit configured to generate and output an intermediate signal of an intermediate frequency according to the frequency control word and the reference time unit; and, a frequency multiplication sub-circuit configured to generate and output an output signal of the compensated frequency according to the intermediate signal.

For example, in a frequency compensator according to at least one embodiment of the present disclosure, the frequency multiplication sub-circuit comprises: a first phase-locked loop configured to perform frequency multiplication on the intermediate signal of the intermediate frequency according to the frequency multiplication parameter so as to obtain an output signal of the compensated frequency.

For example, in a frequency compensator according to at least one embodiment of the present disclosure, the reference time unit generation sub-circuit comprises: a voltage controlled oscillator configured to oscillate at a predetermined oscillation frequency; a second phase-locked loop configured to lock an output frequency of the voltage controlled oscillator to a reference output frequency which is related to the initial frequency; K output terminals configured to output K output signals of the reference output frequency with evenly-spaced phases, where K is a positive integer greater than 1, wherein the reference output frequency is expressed as $f_A$, the reference time unit is a time span between any two adjacent output signals output from the K output terminals, the reference time unit is expressed as $\Delta$, and $\Delta=1/(K \cdot f_A)$.

For example, in a frequency compensator according to at least one embodiment of the present disclosure, the intermediate frequency is:

$$f_s=(K/F) \cdot f_\Delta,$$

wherein $f_s$ represents the intermediate frequency and F is the frequency control word.

For example, in a frequency compensator according to at least one embodiment of the present disclosure, the compensated frequency is $f_o=(K \cdot N \cdot C/F)f_c$, wherein $f_c$ represents the initial frequency, N is the frequency multiplication parameter, F is the frequency control word, and C represents a constant.

For example, in the frequency compensator according to at least one embodiment of the present disclosure, the frequency adjustment sub-circuit is a Time-Average-Frequency Direct Period synthesizer.

At least one embodiment of the present disclosure also provides an electronic device comprising a frequency source and a frequency compensator according to any embodiment of the present disclosure. The frequency source is configured to provide an input signal of an initial frequency.

At least one embodiment of the present disclosure also provides a frequency compensation method applied in a frequency compensator according to any embodiment of the present disclosure. The method comprises: generating a frequency control word according to an initial frequency and a target frequency; and generating and outputting an output signal of a compensated frequency according to the frequency control word and the input signal of the initial frequency.

For example, in a frequency compensation method according to at least one embodiment of the present disclosure, generating the frequency control word according to the initial frequency and the target frequency comprises: obtaining the initial frequency; obtaining the target frequency and a frequency multiplication parameter; generating the frequency control word according to the initial frequency, the target frequency, and the frequency multiplication parameter.

For example, in a frequency compensation method according to at least one embodiment of the present disclosure, generating and outputting the output signal of the compensated frequency according to the frequency control word and the input signal of the initial frequency comprises: receiving an input signal of the initial frequency; generating and outputting a reference time unit according to the initial frequency; generating and outputting an intermediate signal of an intermediate frequency according to the frequency control word and the reference time unit; and generating and outputting an output signal of the compensated frequency according to the intermediate signal.

For example, in a frequency compensation method according to at least one embodiment of the present disclosure, generating and outputting an output signal of the compensated frequency according to the intermediate signal comprises: performing frequency multiplication on the intermediate signal of the intermediate frequency according to the frequency multiplication parameter so as to obtain an output signal of the compensated frequency.

BRIEF DESCRIPTION OF THE DRAWINGS

In order to illustrate the technical solutions of the embodiments of the present disclosure more clearly, the drawings of the embodiments will be briefly described below. It is obvious that the drawings described below merely relate to some embodiments of the present disclosure and do not limit the present disclosure.

DETAILED DESCRIPTION OF THE EMBODIMENTS

To make the objectives, technical solutions, and advantages of the embodiments of the present disclosure more clear, the technical solutions of the embodiments of the present disclosure will be described clearly and completely below in conjunction with the accompanying drawings of the embodiments of the present disclosure. Obviously, the described embodiments are only some of the embodiments of the present disclosure, but not all of the embodiments. Other embodiments that may be obtained by those skilled in the art according to the embodiments described in the present disclosure without creative efforts shall fall within the protection scope of the present disclosure.

Unless defined otherwise, technical terms or scientific terms used here should be of the common meaning understood by those skilled in the field to which the present disclosure pertains. The word "first", "second", and the like used in this disclosure does not denote any order, quantity, or importance, but rather merely intends to distinguish between different components. The word such as "comprise", "include" or the like used herein means that the element or item preceding the word encompasses the elements or items enumerated after the word and their equivalents, without excluding other elements or items. The word "connect", "couple" or the like used herein is not limited to a physical or mechanical connection, but may comprise an electrical connection, whether direct or indirect. "Up," "down," "left," "right," and the like are used only to indicate relative positional relationships. When the absolute position of the described object changes, the relative positional relationship may change accordingly. In order to make the following description of the embodiments of the present disclosure clear and concise, detailed descriptions of known functions and known components are omitted in the present disclosure.

A clock signal is an important control signal. The clock signal can be generated directly from the frequency source or indirectly through a phase-locked loop (PLL). A typical clock system may comprise a frequency source and a counting circuit (for counting, setting, and synchronizing). When two or more clock oscillators have the same frequency, these clock oscillators resonate synchronously. When these clock oscillators are consistent in time, these clock oscillators are synchronized in time (simultaneity). Because the oscillators have random errors and system errors, clock signals cannot completely synchronize with each other in time. Temperature Compensated Crystal Oscillators (TCXO) and Oven Controlled Crystal Oscillators (OCXO) and the like have better frequency stabilities than low-level frequency sources, so they may be applied in high-performance systems. However, the costs of TCXO and OCXO are relatively high.

Figure 1:
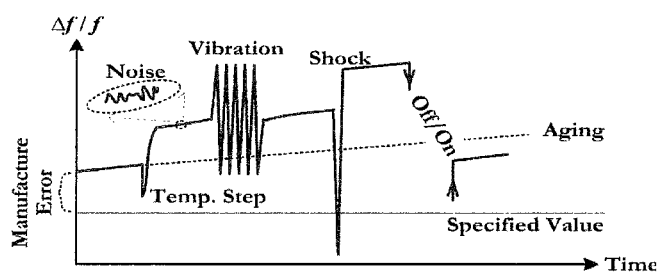
FIG. 1 is a schematic diagram of various factors that may affect frequency stability of a frequency source.

FIG. 1 shows a schematic diagram of various factors that may affect the frequency stability of a frequency source.

For example, as shown in FIG. 1, the major factors affecting the frequency stability of the frequency source comprise temperature's step changes, aging, vibrations, manufacturing errors, shocks, oscillator's on/off switching, noise, and the like. These factors eventually result in the fact that the actual frequency generated by the frequency source is not the same as the specified frequency (i.e., the target frequency). That is, a frequency error occurs. The frequency errors caused by the manufacturing errors, temperature's step changes, and aging can be compensated. When the frequency source is manufactured or installed in an electronic system, the structure of the frequency source cannot be changed. Therefore, during the operation of the frequency source, the frequency error of the frequency source should be compensated through a frequency compensation method, so to meet the actual requirement of the user. In addition, the frequency compensation method should perform the frequency compensation without modifying the structure of the frequency source.

Time-Average-Frequency Direct Period Synthesis (TAF-DPS) technology is a newly emerging frequency synthesis technology which may generate a pulse signal at any frequency. In other words, the TAF-DPS synthesizer can implement fine frequency adjustment of small frequency granularity. In addition, since each single pulse is constructed directly, the output frequency of the TAF-DPS synthesizer can be changed instantaneously. That is, the TAF-DPS synthesizer has the rapidity of frequency switching. Experiments have shown that the frequency granularity of the TAF-DPS synthesizer can be several ppb (parts per billion). The ability to generate any frequency and to support rapid frequency switching is a major advantage of the TAF-DPS synthesizer over conventional frequency sources. The TAF-DPS synthesizer can be a specific implementation of the frequency adjustment sub-circuit in an embodiment of the present disclosure.

It should be noted that, in the present disclosure, both ppm and ppb may be used to represent the frequency deviation, and ppm or ppb represent a value of an allowable frequency deviation at a specific center frequency. For example, X ppm indicates that the maximum frequency error is X parts per million of the center frequency. Similarly, X ppb indicates that the maximum frequency error is X parts per billion of the center frequency. The frequency is expressed in Hertz (Hz) and the conversion between ppm and Hz is as follows:

$$\Delta f = (f \cdot ppm)/10^6$$

The conversion between ppb and Hz is as follows:

$$\Delta f = (f \cdot ppb)/10^9$$

wherein f denotes the center frequency and $\Delta f$ denotes the allowed maximum frequency error.

At least one embodiment of the present disclosure provides a frequency compensator, an electronic device, and a frequency compensation method. The frequency compensator comprises: a control circuit and a frequency compensation circuit. The control circuit is configured to generate a frequency control word according to an initial frequency and an target frequency. The frequency compensation circuit is configured to receive an input signal of the initial frequency; and to generate and output an output signal of a compensated frequency according to the frequency control word and the input signal of the initial frequency.

The frequency compensator according to the embodiments of the present disclosure can perform frequency compensation without modifying the physical structure of the frequency source, correct the frequency error, and increase the frequency stability of the frequency source, thereby prolonging the service life of the electronic device and reducing the cost of the electronic device.

Advantages of the frequency compensator, the electronic device, and the frequency compensation method according to the embodiments of the present disclosure comprise, but are not limited to:

(1) Low cost and flexibility of implementation. The TAF-DPS-based frequency compensator can be fully digitally designed and implemented in a programmable logic device (e.g., an FPGA) through HDL coding. The parameters of the frequency compensator may be reset simply at any time. Therefore, the function of the frequency compensator may be realized by a general FPGA or other programmable device, avoiding the need for a dedicated circuit. Of course, the function of the frequency compensator may also be realized by an ASIC.

(2) High precision. The frequency/period of the pulse signal output from the TAF-DPS can be precisely controlled, and its frequency resolution can be several parts per billion, so that the frequency error of the frequency source can be accurately compensated.

Hereafter, the embodiments of the present disclosure will be described in detail with reference to the accompanying drawings, but the disclosure is not limited to these specific embodiments.

Figure 2:
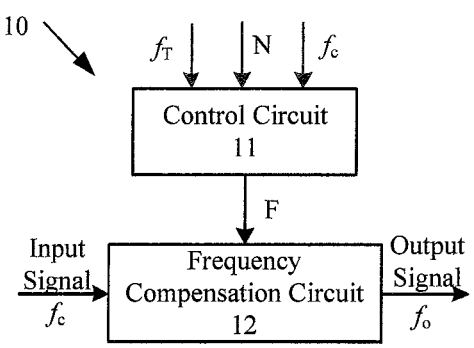
FIG. 2 is a schematic block diagram of a frequency compensator according to an embodiment of the present disclosure.
Figure 3:
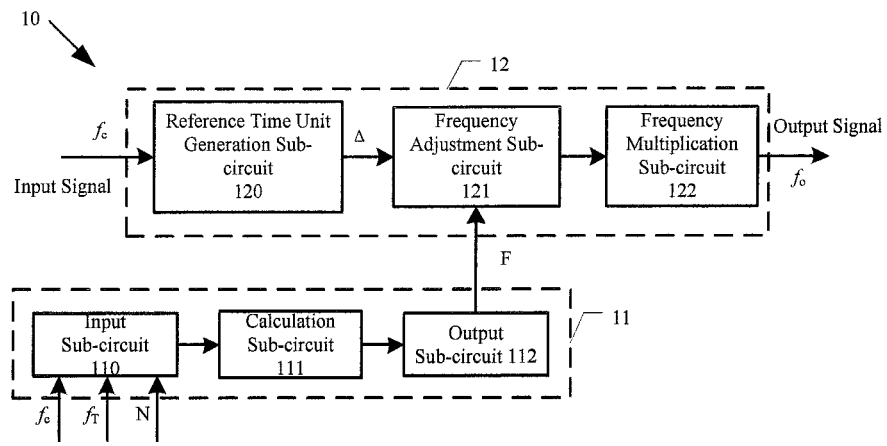
FIG. 3 is another schematic block diagram of a frequency compensator according to an embodiment of the present disclosure.
Figure 4:
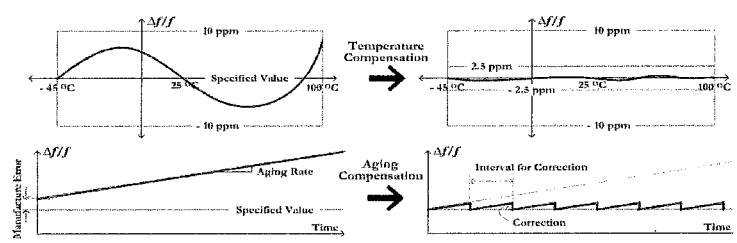
FIG. 4 is a frequency compensation graph according to an embodiment of the present disclosure.

FIG. 2 shows a schematic block diagram of a frequency compensator according to an embodiment of the present disclosure. FIG. 3 shows another schematic block diagram of a frequency compensator according to an embodiment of the present disclosure. FIG. 4 shows a frequency compensation graph according to an embodiment of the present disclosure.

For example, as shown in FIG. 2, the frequency compensator 10 according to an embodiment of the present disclosure may comprise a control circuit 11 and a frequency compensation circuit 12. The control circuit 11 is configured to generate a frequency control word according to an initial frequency and a target frequency. The frequency compensation circuit 12 is configured to receive an input signal of the initial frequency, and to generate and output an output signal of a compensated frequency according to the frequency control word and the input signal of the initial frequency.

For example, the input signal of the initial frequency received by the frequency compensation circuit 12 may be generated by a frequency source. The initial frequency may represent the actual frequency of the signal generated and output by the frequency source. The target frequency may represent the user's expected frequency of the signal generated and output by the frequency source (i.e., the frequency of the signal generated and output by the frequency source in an ideal state).

For example, as shown in FIG. 4, the initial frequency may be not equal to the target frequency due to manufacturing errors, temperature's step changes, and frequency source aging. For example, before the frequency compensation, the frequency error between the initial frequency and the target frequency may up to ±10 ppm due to the temperature's step changes. Due to the aging of the electronic device, the frequency error between the initial frequency and the target frequency may increase over time and accumulate gradually. At the same time, there is a fixed error between the initial frequency and the target frequency due to manufacturing error. After the frequency compensation is performed by using the frequency compensator according to the embodiments of the present disclosure, the frequency error due to temperature can be controlled within ±2.5 ppm. The frequency error due to aging can be controlled within a fixed interval for correction, without accumulating over time. Therefore, the frequency compensator according to the embodiments of the present disclosure can realize frequency compensation, correct frequency error, increase frequency stability of the frequency source, prolong the service life of the electronic device, and reduce the cost of the electronic device, without modifying the physical structure of the frequency source.

For example, the frequency control word may vary according to the initial frequency and the target frequency. For example, for a same initial frequency, if the target frequency changes, the frequency control word will change accordingly. Similarly, for a same target frequency, if the initial frequency changes, the frequency control word will change accordingly.

For example, both the input signal and the output signal may be pulse signals.

For example, a frequency control word is used to control the frequency of the output signal. In the present disclosure, the frequency of the output signal is referred to as the compensated frequency, for convenience of description without causing ambiguity. Such a name comes in that the frequency of the output signal is obtained by compensating the initial frequency of the input signal by the frequency compensator and thus is closer to or even equal to the target frequency. The frequency compensation circuit 12 may use the frequency control word to generate an output signal, and make the frequency of the generated output signal closer to the target frequency. The compensated frequency of the generated output signal can be changed by changing the frequency control word. For example, for a same initial frequency, if the frequency control word changes, the compensated frequency will change accordingly. Thus the input signals of a same initial frequency can be converted into output signals of different compensated frequencies, so as to meet the needs of different electronic devices.

For example, as shown in FIG. 3, the control circuit 11 may comprise an input sub-circuit 110, a calculation sub-circuit 111, and an output sub-circuit 112. The input sub-circuit 110 is configured to obtain the initial frequency, target frequency, and a frequency multiplication parameter. The calculation sub-circuit 111 is configured to generate a frequency control word according to the initial frequency, the target frequency and the frequency multiplication parameter. The output sub-circuit 112 is configured to output the frequency control word to the frequency compensation circuit 12.

For example, the input sub-circuit 110 may comprise a frequency detector. The frequency detector detects the initial frequency of the input signal input into the input sub-circuit 110, and outputs the detected initial frequency to the calculation sub-circuit 111. For example, the frequency detector may be an oscilloscope, a sensor, or the like.

For example, the calculation sub-circuit 111 is configured to receive the initial frequency, the target frequency and the frequency multiplication parameter transmitted from the input sub-circuit 110, and to calculate the frequency control word according to the initial frequency, the target frequency and the frequency multiplication parameter. For example, the calculation sub-circuit 111 may calculate the frequency control word according to the following formula (1):

$$F=(K \cdot N \cdot C \cdot f_c)/f_T \qquad (1)$$

wherein F represents the frequency control word, N represents the frequency multiplication parameter, $f_c$ represents the initial frequency, $f_T$ represents the target frequency, K represents a positive integer greater than 1, and C is a constant. K is further described below with reference to FIG. 6.

For example, the output sub-circuit 112 may output the frequency control word F calculated by the calculation sub-circuit 111 to the frequency compensation circuit 12 under the control of a clock signal.

For example, the calculation sub-circuit 111 and the output sub-circuit 112 may be implemented in hardware. The calculation sub-circuit 111 may be, for example, consisted of components such as transistors, resistors, capacitors, and amplifiers. The output sub-circuit 112 may be, for example, consisted of components such as triggers. Of course, the functions of the calculation sub-circuit 111 and the output sub-circuit 112 may also be implemented in software. For example, the functions of the calculation sub-circuit 111 and the output sub-circuit 112 may be implemented by a processor executing instructions and data stored in a memory.

For example, the control circuit 11 may be implemented in hardware. Of course, the functions of the control circuit 11 may also be implemented in software. For example, the control circuit 11 may comprise a processor and a memory. The processor may execute instructions and data stored in the memory to implement the functions of generating the frequency control word according to the initial frequency and the target frequency.

For example, as shown in FIG. 3, the frequency compensation circuit 12 may comprise a reference time unit generation sub-circuit 120, a frequency adjustment sub-circuit 121, and a frequency multiplication sub-circuit 122. The reference time unit generation sub-circuit 120 is configured to receive an input signal of the initial frequency, and to generate and output a reference time unit according to the initial frequency. The frequency adjustment sub-circuit 121 is configured to generate and output an intermediate signal of an intermediate frequency in accordance with the frequency control word and the reference time unit. The frequency multiplication sub-circuit 122 is configured to generate and output an output signal of a compensated frequency according to the intermediate signal.

For example, the frequency multiplication sub-circuit 122 may comprise a first phase-locked loop. The first phase-locked loop is configured to perform frequency multiplication on the intermediate signal of the intermediate frequency according to the frequency multiplication parameter so as to obtain the output signal of the compensated frequency.

Figure 6:
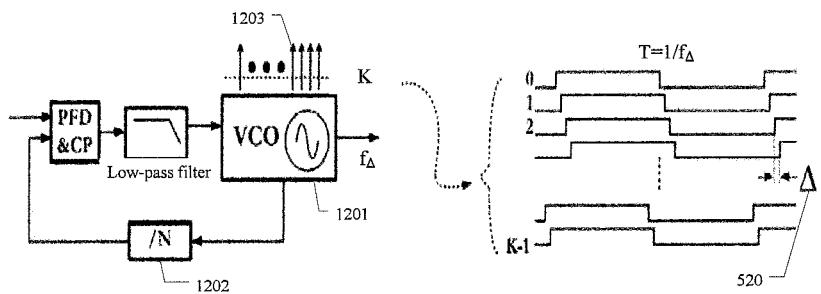
FIG. 6 is a schematic structural diagram of a reference time unit generation sub-circuit according to an embodiment of the present disclosure.

For example, the first phase-locked loop may comprise a phase detector (PD), a loop filter (LF), a voltage controlled oscillator (VCO), and a frequency divider. The phase detector PD may comprise a phase frequency detector (PFD) and a charge pump (CP) as shown in FIG. 6. The frequency multiplication parameter may be predetermined and depends on the frequency division factor of the frequency divider.

For example, in the embodiment of the present disclosure, the intermediate signal of the intermediate frequency may firstly be input into the phase detector, then into the loop filter, next into the voltage-controlled oscillator, and finally into the frequency divider to be frequency divided and fed back to the phase detector. Thus, the first phase-locked loop may generate an output signal of the compensated frequency. By adjusting the frequency division factor of the frequency divider (e.g., a programmed frequency divider), the desired compensated frequency may be obtained. For example, if the frequency multiplication parameter of the first phase-locked loop is the frequency multiplication parameter (N) in the formula (1), the frequency division factor of the frequency divider may be 1/N.

For example, the compensated frequency may be calculated according to the following formula (2):

$$f_o = N \cdot f_s \quad (2)$$

wherein $f_o$ represents the compensated frequency and $f_s$ represents the intermediate frequency.

For example, the first phase-locked loop may comprise a phase-locked loop (PLL) or a delay-locked loop (DLL).

Figure 5:
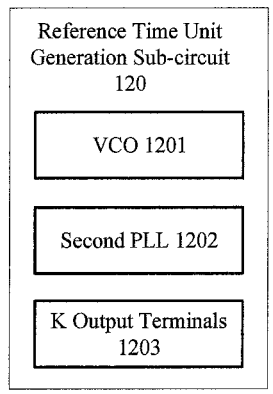
FIG. 5 is a schematic block diagram of a reference time unit generation sub-circuit according to an embodiment of the present disclosure.

FIG. 5 shows a schematic block diagram of a reference time unit generation sub-circuit according to an embodiment of the present disclosure. FIG. 6 shows a schematic structural diagram of a reference time unit generation sub-circuit according to an embodiment of the present disclosure.

For example, the reference time unit generation sub-circuit 120 is configured to generate, according to the initial frequency, and output K reference output signals with evenly-spaced phases and a reference time unit. As shown in FIG. 5, the reference time unit generation sub-circuit 120 may comprise a voltage controlled oscillator (VCO) 1201, a second phase-locked loop 1202, and K output terminals 1203. The voltage controlled oscillator 1201 is configured to oscillate at a predetermined oscillation frequency. The second phase-locked loop 1202 is configured to lock the output frequency of the voltage controlled oscillator 1201 to the reference output frequency. The K output terminals 1203 are configured to output K reference output signals of the reference output frequency with evenly-spaced phases, where K is a positive integer greater than 1.

For example, K in formula (1) may represent the number of signals with evenly-spaced phases generated by the reference time unit generating sub-circuit 120. That is, K in formula (1) denotes the number of signals with evenly-spaced phases output from the K output terminals 1203. For example, K=16, 32 or other values.

For example, as shown in FIG. 6, the reference time unit 520 may be expressed as Δ. The reference time unit 520 is a time span between any two adjacent reference output signals output from the K output terminals 1203. The reference time unit 520 is typically generated by a multi-stage voltage controlled oscillator 1201. The frequency output from the voltage controlled oscillator 1201 may be locked to a known reference output frequency by the second phase-locked loop 1202. The reference output frequency may be expressed as $f_A$. For example, the reference time unit 520 may be calculated according to the following formula (3):

$$\Delta = T_A/K = 1/(K \cdot f_A) \quad (3)$$

wherein $T_A$ represents the period of the multi-stage voltage controlled oscillator 1201.

For example, the reference output frequency is related to the initial frequency, and the reference output frequency may be expressed as the following formula (4):

$$f_A = C \cdot f_c \quad (4)$$

wherein C is a constant.

For example, the second phase-locked loop may also comprise a phase-locked loop (PLL) or a delay locked loop (DLL). For example, if the second phase-locked loop is a DLL, the reference output frequency may be expressed as $f_A = f_c$. If the second phase-locked loop is a PLL and the frequency division factor of the frequency divider in the PLL is 1/K, and C=1/K, the reference output frequency may be expressed as $f_A = f_c/K$. According to formula (3), the reference time unit 520 is $\Delta = 1/(K \cdot f_A) = 1/f_c = T_c$, wherein $T_c$ is the period of the input signal of the initial frequency.

For example, if C=1/K, the frequency control word shown in formula (1) may be simplified as shown in the following formula (5):

$$F = (N \cdot f_c)/f_T \quad (5)$$

It can be seen from the formula (5) that the frequency control word is only related to the initial frequency ($f_c$), the target frequency ($f_T$) and the frequency multiplication parameter (N).

It should be noted that the circuit structure on the left side of FIG. 6 is only an exemplary implementation of the reference time unit generation sub-circuit 120. The reference time unit generation sub-circuit 120 is not limited to the described specific structure, but rather it may also be constructed in other circuit structures. In this regard, the disclosure is not limited herein.

Figure 7:
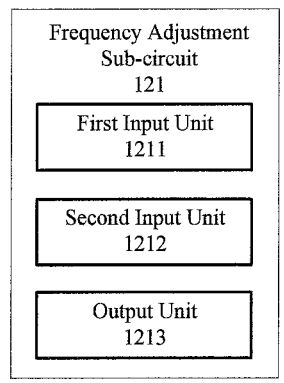
FIG. 7 is a schematic block diagram of a frequency adjustment sub-circuit according to an embodiment of the present disclosure.
Figure 8:
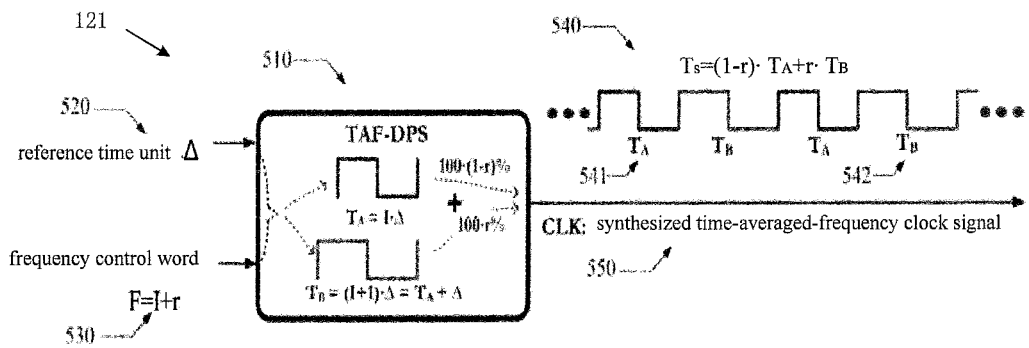
FIG. 8 is a schematic operation principle diagram of a frequency adjustment sub-circuit according to an embodiment of the present disclosure.

FIG. 7 shows a schematic block diagram of a frequency adjustment sub-circuit according to an embodiment of the present disclosure. FIG. 8 shows a schematic operation principle diagram of a frequency adjustment sub-circuit according to an embodiment of the present disclosure.

For example, as shown in FIG. 7, the frequency adjustment sub-circuit 121 comprises a first input unit 1211, a second input unit 1212, and an output unit 1213. The first input unit 1211 is configured to receive the K reference output signals with evenly-spaced phases and the reference time unit 520 from the reference time unit generation sub-circuit 120. The second input unit 1212 is configured to receive the frequency control word from the control circuit 11. The output unit 1213 is configured to generate and output an intermediate signal of an intermediate frequency that matches the frequency control word (F) and the reference time unit 520.

For example, the intermediate signal may be a pulse signal.

For example, the frequency adjustment sub-circuit 121 may be a Time-Average-Frequency Direct Period synthesizer (TAF-DPS synthesizer). The TAF-DPS synthesizer may be implemented by programmable logic devices (e.g., ASICs or FPGAs). Alternatively, the TAF-DPS synthesizer may be implemented by conventional analog circuit devices. In this regard, the disclosure is not limited herein.

Hereafter, the operation principle of the frequency adjustment sub-circuit based on the TAF-DPS synthesizer will be described with reference to FIG. 8.

For example, as shown in FIG. 8, the frequency adjustment sub-circuit 121 based on the TAF-DPS synthesizer 510 has two inputs: the reference time unit Δ 520 and the frequency control word (F) 530, wherein F=I+r, and I is an integer greater than 1, and r is a fraction.

For example, the TAF-DPS synthesizer 510 has one output CLK 550. The CLK 550 is a synthesized time-averaged-frequency clock signal. In an embodiment of the present disclosure, CLK 550 is the intermediate signal of the intermediate frequency. Starting from the reference time unit 520, the TAF-DPS synthesizer 510 may generate two types of periods, namely a first period $T_A=I\cdot\Delta$ and a second period $T_B=(I+1)\cdot\Delta$. The output CLK 550 is a clock pulse sequence 540, and this clock pulse sequence 540 is constituted of the first period $T_A$ 541 and the second period $T_B$ 542 in an interleaved manner. The fraction r is used to control the probability of occurrence of the second period $T_B$. Therefore, r may also determine the probability of occurrence of the first period $T_A$.

For example, as shown in FIG. 8, the period $T_s$ of the output CLK 550 may be expressed as the following formula (6):

$$T_s=(1-r)\cdot T_A+r\cdot T_B$$

$$=T_A+r\cdot(T_B-T_A)=T_A+r\cdot\Delta=I\cdot\Delta+r\cdot\Delta=(I+r)\cdot\Delta \quad (6)$$

Therefore, if the frequency control word is F=I+r, then:

$$T_s=F\cdot\Delta \quad (7)$$

It can be seen from the above formula (7) that the period $T_s$ of the intermediate signal output from the TAF-DPS synthesizer 510 is linearly proportional to the frequency control word (F). If the frequency control word (F) changes, the period $T_s$ of the intermediate signal output from the TAF-DPS synthesizer 510 will change in the same manner.

In addition, since the period T is inversely proportional to the frequency f, if a predetermined condition is satisfied, for example, if the variation of the frequency control word (F) is very small (less than a predetermined threshold), the intermediate frequency of the output intermediate signal may follow the change of the waveform of the frequency control word (F) in an approximate linear manner.

Therefore, the control circuit 11 may generate a frequency control word corresponding to the target frequency according to the initial frequency and the target frequency, and then generate an intermediate signal of an intermediate frequency by the TAF-DPS synthesizer 510. The intermediate frequency corresponds to the frequency control word. That is, the intermediate frequency corresponds to the target frequency.

For example, in combination with the formulas (3) and (7), the intermediate frequency may be expressed as the following formula (8):

$$f_s=(K/F)\cdot f_\Delta \quad (8)$$

wherein $f_s$ represents the intermediate frequency.

For example, in combination with the formulas (2), (4) and (8), the output compensated frequency may be expressed as the following formula (9):

$$f_o=(K\cdot N\cdot C/F)f_c \quad (9)$$

For example, if the second phase-locked loop is a PLL, and the frequency division factor of the frequency divider in the PLL is 1/K, C=1/K, the formula (9) may be simplified as the following formula (10):

$$f_o=(N/F)f_c \quad (10)$$

For example, suppose the target frequency is 100 MHz, the frequency multiplier parameter is 16, and the measured initial frequency is 99.999723 MHz, then the frequency error between the initial frequency and the target frequency is 2.77 Hz. According to formula (5), the frequency control word may be calculated as:

$$F=16\cdot(99.999723\text{ MHz}/100\text{ MHz})=15.99995568$$

The precision of the frequency generated by the TAF-DPS synthesizer 510 depends on the number of digits allocated to r. In the case where the memory capacity is sufficiently large, i.e., a sufficient number of digits is given to r in the frequency control word (F), the frequency control word may correspond to any target frequency, and thus the TAF-DPS synthesizer 510 may generate an intermediate frequency corresponding to any target frequency. Suppose there are enough resources (i.e. the number of digits of the fractional part r is enough), e.g. F=15.99995568, then the compensated frequency may be calculated according to formula (10):

$$f_o=(16/15.99995568)\cdot 99.999723=100\text{ MHz}.$$

If the number of digits of the fractional part r is 7, F=15.9999557. According to formula (10), the compensated frequency may be calculated as:

$$f_o=(16/15.9999557)\cdot 99.999723=99.999999\text{ MHz}.$$

Thus, the frequency compensator according to the disclosed embodiment may reduce the frequency error between the initial frequency and the target frequency from 277 Hz to about 1 Hz (i.e., a frequency error closer to 0 Hz). In the case that there are sufficient resources (the number of digits of the fractional part r is large enough), the compensated frequency is exactly the same as the target frequency, i.e. the frequency error between the initial frequency and the target frequency is reduced to 0 Hz.

Figure 9A:
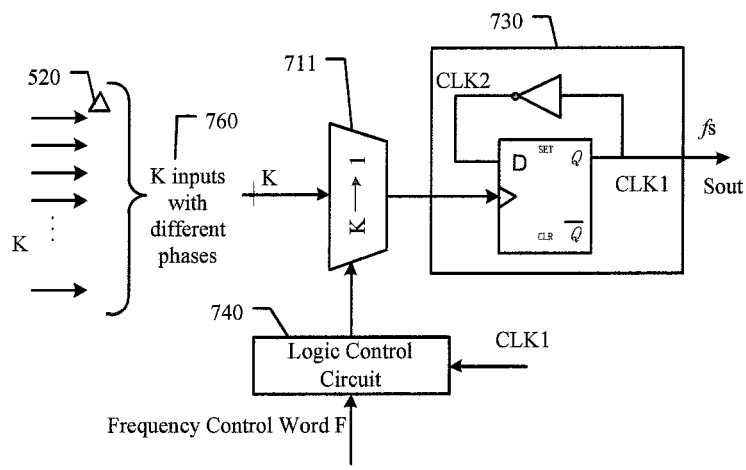
FIG. 9A is a schematic structural diagram of a frequency adjustment sub-circuit according to an embodiment of the present disclosure.
Figure 9B:
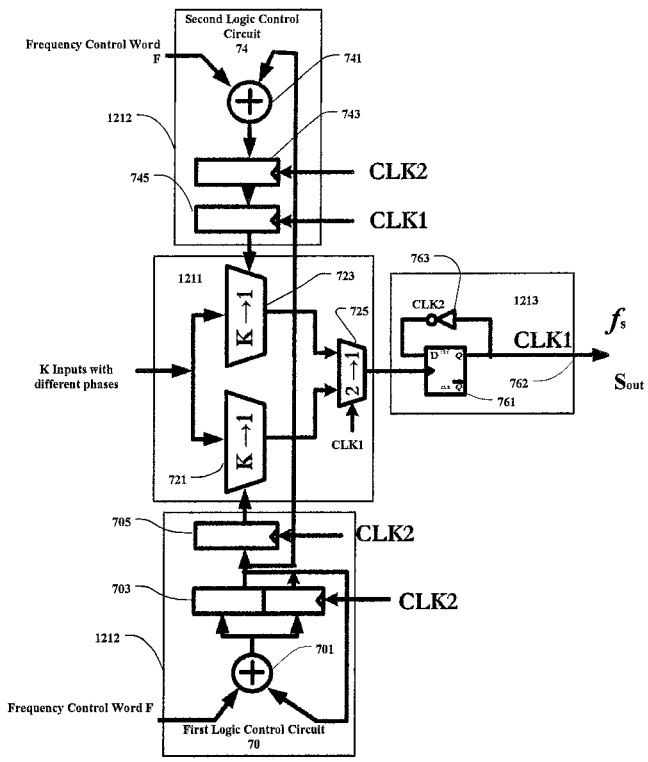
FIG. 9B is a schematic structural diagram of another frequency adjustment sub-circuit according to an embodiment of the present disclosure.

FIG. 9A is a schematic structural diagram of a frequency adjustment sub-circuit according to an embodiment of the present disclosure. FIG. 9B is a schematic structural diagram of another frequency adjustment sub-circuit according to an embodiment of the present disclosure.

Hereafter, the circuit structure of the TAF-DPS synthesizer will be described with reference to FIGS. 9A and 9B.

For example, as shown in FIG. 9A, in one embodiment, the first input unit 1211 comprises a K to 1 multiplexer 711. The K to 1 multiplexer 711 has a plurality of input terminals for receiving K reference output signals with evenly-spaced phases, a control input terminal, and an output terminal.

For example, the output unit 1213 comprises a trigger circuit 730. The trigger circuit 730 is used to generate a pulse sequence. For example, the pulse sequence is consisted of pulse signals of the first period $T_A$ and pulse signals of the second period $T_B$ in an interleaved manner. The trigger circuit 730 comprises a D trigger, an inverter, and an output terminal. The D trigger comprises a data input terminal, a clock input terminal for receiving the output from the output terminal of the K to 1 multiplexer 711, and an output terminal for outputting a first clock signal CLK1. The inverter comprises an inverter input terminal for receiving the first clock signal CLK1 and an inverter output terminal for outputting a second clock signal CLK2. The output terminal of the trigger circuit 730 is used to output the first clock signal CLK1 as an intermediate signal $S_{out}$ of an intermediate frequency.

For example, the first clock signal CLK1 comprises a pulse sequence. The second clock signal CLK2 is connected to the data input terminal of the D trigger.

For example, the second input unit 1212 comprises a logic control circuit 740. The logic control circuit 740 has an input terminal for receiving the frequency control word (F) output from the control circuit 11, a clock input terminal for receiving the first clock signal CLK1, and a output terminal connected to the control input terminal of the K to 1 multiplexer.

For example, as shown in FIG. 9B, in another embodiment, the first input unit 1211 comprises a first K to 1 multiplexer 721, a second K to 1 multiplexer 723, and a 2 to 1 multiplex Multiplexer 725. The first K to 1 multiplexer 721 and the second K to 1 multiplexer 723 each comprise a plurality of input terminals for receiving K signals with evenly-spaced phases, a control input terminal, and an output terminal. The 2 to 1 multiplexer 725 comprises a control input terminal, an output terminal, a first input terminal for receiving the output of the first K to 1 multiplexer 721 and a second input terminal for receiving the output of the second K to 1 multiplexer 723.

For example, the output unit 1213 comprises a trigger circuit. The trigger circuit is used to generate a pulse sequence. The trigger circuit comprises a D trigger 761, an inverter 763, and an output terminal 762. The D trigger 761 comprises a data input terminal, a clock input terminal for receiving the output from the output terminal of the 2 to 1 multiplexer 725, and an output terminal for outputting a first clock signal CLK1. The inverter 763 comprises an input terminal for receiving the first clock signal CLK1 and an output terminal for outputting a second clock signal CLK2. The output terminal 762 of the trigger circuit is used to output the first clock signal CLK1 as an intermediate signal $S_{out}$ of an intermediate frequency.

For example, the first clock signal CLK1 is connected to the control input terminal of the 2 to 1 multiplexer 725, and the second clock signal CLK2 is connected to the data input terminal of the D trigger 761.

For example, the second input unit 1212 comprises a first logic control circuit 70 and a second logic control circuit 74. The first logic control circuit 70 comprises a first adder 701, a first register 703, and a second register 705. The second logic control circuit 74 comprises a second adder 741, a third register 743, and a fourth register 745.

The first adder 701 adds the frequency control word (F) and the most significant bits (e.g., 5 bits) stored in the first register 703, and then saves the addition result in the first register 703 at a rising edge of the second clock signal CLK2. Alternatively, the adder 701 adds the frequency control word (F) and all the information stored in the first register 703, and then stores the addition result in the first register 703 at a rising edge of CLK2. At a next rising edge of the second clock signal CLK2, the most significant bits stored in the first register 703 will be stored into the second register 705 and used as a selection signal for the first K to 1 multiplexer 721 to select one of the K input signals with different phases as a first output signal of the first K to 1 multiplexer 721.

The second adder 741 adds the frequency control word (F) and the most significant bits stored in the first register 703, and then saves the addition result in the third register 743 at a rising edge of the second clock signal CLK2. At a next rising edge of the second clock signal CLK2, the information stored in the third register 743 will be stored into the fourth register 745 and used as a selection signal of the second K to 1 multiplexer 723 to select one of the K input signals with different phases as a second output signal of the second K to 1 multiplexer 723.

The 2 to 1 multiplexer 725 selects, at a rising edge of the first clock signal CLK1, one of the first output signal from the first K to 1 multiplexer 721 and the second output from the second K to 1 multiplexer 723 as an output signal of the 2 to 1 multiplexer 725, which is used as an input clock signal to the D trigger 761.

For example, the period ($T_s$) of the intermediate signal $S_{out}$ output from the TAF-DPS synthesizer, as shown in FIGS. 9A and 9B, may be calculated according to the formula (7). For example, the frequency control word (F) is set in the form of F=I+r, where I is an integer in the range of [2,2K] and r is a decimal in the range of [0,1).

In addition, as to the operation principle of the TAF-DPS, reference may be made to L. XIU, "Nanometer Frequency Synthesis beyond the Phase-Locked Loop", Piscataway, N.J. 08854, USA, John Wiley IEEE-press, 2012, and L. XIU, "From Frequency to Time-Average-Frequency: a Paradigm Shift in the Design of Electronic System", Piscataway, N.J. 08854, USA, John Wiley IEEE-press, 2015, which are hereby incorporated by reference in their entireties.

Figure 10:
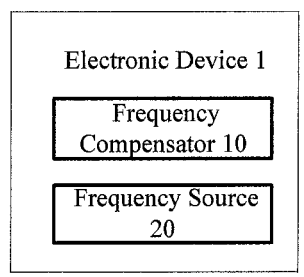
FIG. 10 is a schematic block diagram of an electronic device according to an embodiment of the present disclosure.

FIG. 10 shows a schematic block diagram of an electronic device according to an embodiment of the present disclosure.

For example, as shown in FIG. 10, the electronic device 1 according to the embodiment of the present disclosure comprises a frequency source 20 and a frequency compensator 10 described above.

For example, the frequency source 20 is configured to provide an input signal of an initial frequency, and to transmit the input signal to the frequency compensator 10.

For example, the frequency source 20 may comprise a self-oscillating source and a synthetic frequency source. The self-oscillating source may comprise a crystal oscillator, a cavity oscillator, and a voltage-controlled oscillator. The synthetic frequency source may comprise a direct analog frequency source, a direct digital frequency source, an indirect analog frequency source, and an indirect digital frequency source.

Figure 11:
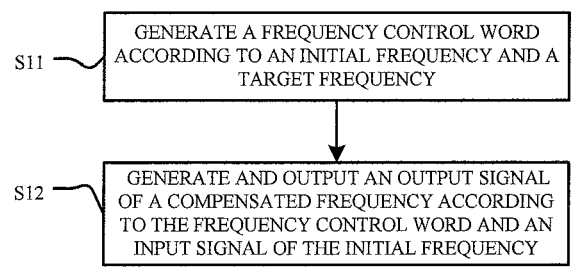
FIG. 11 is a schematic flowchart of a frequency compensation method according to an embodiment of the present disclosure.

FIG. 11 shows a schematic flowchart of a frequency compensation method according to an embodiment of the present disclosure. The frequency compensation method according to the embodiment of the present disclosure may be applied in a frequency compensator according to any embodiment of the present disclosure.

For example, as shown in FIG. 11, the frequency compensation method according to the embodiment of the present disclosure may comprise the following operations:

S11 of generating a frequency control word according to an initial frequency and a target frequency;

S12 of generating and outputting an output signal of a compensated frequency according to the frequency control word and the input signal with the initial frequency.

The description of the frequency compensation method can be understood with reference to the description of the frequency compensator in the above description, and thus will be omitted here. The frequency compensation method according to the embodiment of the present disclosure can perform frequency compensation without modifying the physical structure of the frequency source, correct the frequency error, increase the frequency stability of the frequency source, thereby prolonging the service life of the electronic device and reducing the cost of the electronic device.

For example, the operation S11 may comprise: obtaining an initial frequency; obtaining a target frequency and a frequency multiplication parameter; and, generating a frequency control word according to the initial frequency, the target frequency, and the frequency multiplication parameter.

For example, the operation S12 may comprise: receiving an input signal of the initial frequency; generating and outputting a reference time unit according to the initial frequency; generating and outputting an intermediate signal of an intermediate frequency according to the frequency control word and the reference time unit; and generating, according to the intermediate signal, and outputting an output signal of a compensated frequency.

For example, the intermediate signal of the intermediate frequency may be generated by a TAF-DPS synthesizer.

For example, generating, according to the intermediate signal, and outputting the output signal of the compensated frequency may comprise: performing frequency multiplication on the intermediate signal of the intermediate frequency according to the frequency multiplication parameter so as to obtain the output signal of the compensated frequency.

It should be noted that the frequency compensation method shown in FIG. 11 may be implemented by the frequency compensator 10 according to any embodiment of the present disclosure, and thus similar operations or steps will be omitted herein.

For this disclosure, the following should be explained:

(1) The drawings of the embodiments of the present disclosure only show parts of structures involved in the embodiments of the present disclosure, and other parts may be made with reference to common designs.

(2) the embodiments of the present disclosure and/or the features in the embodiments may be combined with each other in the case of no conflict to obtain new embodiments.

The foregoing merely describes specific embodiments of the present disclosure. The protection scope of the present disclosure is not limited thereto, but is defined by the protection scope of the claims.

What is claimed is:

1. A frequency compensator, comprising:
   a control circuit configured to generate a frequency control word according to an initial frequency and a target frequency; and
   a frequency compensation circuit is configured to:
      receive an input signal of the initial frequency; and
      generate and output an output signal of a compensated frequency according to the frequency control word and the input signal of the initial frequency,
   wherein the control circuit comprises:
      an input sub-circuit configured to obtain the initial frequency, the target frequency, and a frequency multiplication parameter;
      a calculation sub-circuit configured to generate the frequency control word according to the initial frequency, the target frequency, and the frequency multiplication parameter; and
      an output sub-circuit configured to output the frequency control word to the frequency compensation circuit.

2. The frequency compensator of claim 1, wherein the frequency control word is:

$$F=(K \cdot N \cdot C \cdot f_c)/f_T,$$

wherein F represents the frequency control word, N represents the frequency multiplication parameter, $f_c$ represents the initial frequency, $f_T$ represents the target frequency, K represents a positive integer greater than 1, and C is a constant.

3. A frequency compensator of claim 2, wherein C=1/K, and the frequency control word is $F=(N \cdot f_c)/f_T$.

4. The frequency compensator of claim 1, wherein the frequency compensation circuit comprises:
   a reference time unit generation sub-circuit configured to receive the input signal of the initial frequency, and to generate and output a reference time unit according to the initial frequency;
   a frequency adjustment sub-circuit configured to generate and output an intermediate signal of an intermediate frequency according to the frequency control word and the reference time unit; and
   a frequency multiplication sub-circuit configured to generate and output the output signal of the compensated frequency according to the intermediate signal.

5. The frequency compensator of claim 4, wherein the frequency multiplication sub-circuit comprises:
   a first phase-locked loop configured to perform frequency multiplication on the intermediate signal of the intermediate frequency according to the frequency multiplication parameter so as to obtain an output signal of the compensated frequency.

6. The frequency compensator of claim 5, wherein the reference time unit generation sub-circuit comprises:
   a voltage controlled oscillator configured to oscillate at a predetermined oscillation frequency;
   a second phase-locked loop configured to lock an output frequency of the voltage controlled oscillator to a reference output frequency which is related to the initial frequency;
   K output terminals configured to output K output signals of the reference output frequency with evenly-spaced phases, where K is a positive integer greater than 1,
   wherein the reference output frequency is expressed as $f_\Delta$, the reference time unit is a time span between any two adjacent output signals output from the K output terminals, the reference time unit is expressed as $\Delta$, and $\Delta=1/(K \cdot f_\Delta)$.

7. The frequency compensator of claim 6, wherein the intermediate frequency is:

$$f_s=(K/F) \cdot f_\Delta,$$

wherein $f_s$ represents the intermediate frequency, and F is the frequency control word.

8. The frequency compensator of claim 7, wherein the compensated frequency is $f_o=(K \cdot N \cdot C/F) f_c$, wherein $f_c$ represents the initial frequency, N is the frequency multiplication parameter, F is the frequency control word, and C represents a constant.

9. The frequency compensator of claim 4, wherein the frequency adjustment sub-circuit is a Time-Average-Frequency Direct Period synthesizer.

10. The frequency compensator of claim 5, wherein the frequency adjustment sub-circuit is a Time-Average-Frequency Direct Period synthesizer.

11. The frequency compensator of claim 6, wherein the frequency adjustment sub-circuit is a Time-Average-Frequency Direct Period synthesizer.

12. The frequency compensator of claim 7, wherein the frequency adjustment sub-circuit is a Time-Average-Frequency Direct Period synthesizer.

13. The frequency compensator of claim 8, wherein the frequency adjustment sub-circuit is a Time-Average-Frequency Direct Period synthesizer.

14. An electronic device, comprising:
   a frequency source configured to provide the input signal of the initial frequency; and
   the frequency compensator of claim 1.

* * * * *